(12) United States Patent
Wang

(10) Patent No.: US 7,261,996 B2
(45) Date of Patent: Aug. 28, 2007

(54) HALOGEN-FREE DRY FILM PHOTOSENSITIVE RESIN COMPOSITION

(75) Inventor: Feng-Yi Wang, Kaohsiung (TW)

(73) Assignee: Eternal Chemical Co., Ltd., Kaohsiung, Taiwan (CN)

( * ) Notice: Subject to any disclaimer, the term of this patent is extended or adjusted under 35 U.S.C. 154(b) by 0 days.

(21) Appl. No.: 11/341,878

(22) Filed: Jan. 26, 2006

(65) Prior Publication Data

US 2006/0178448 A1   Aug. 10, 2006

(30) Foreign Application Priority Data

Feb. 5, 2005   (TW) ............................... 94104036 A

(51) Int. Cl.
*G03C 1/805* (2006.01)
*G03C 1/76* (2006.01)
*G03C 1/725* (2006.01)
*G03C 1/73* (2006.01)
*G03C 1/492* (2006.01)

(52) U.S. Cl. .................. 430/270.1; 430/258; 430/259; 430/260; 430/262; 430/263; 430/285.1; 430/287.1; 430/288.1

(58) Field of Classification Search ............. 430/270.1, 430/258–260, 262, 263, 910, 285.1, 287.1, 430/288.1
See application file for complete search history.

(56) References Cited

U.S. PATENT DOCUMENTS 4,725,524 A * 2/1988 Elzer et al. ................. 430/258

* cited by examiner

*Primary Examiner*—Geraldina Visconti
(74) *Attorney, Agent, or Firm*—Ladas and Parry LLP

(57) ABSTRACT

The present invention provides a halogen-free dry film photosensitive resin composition, which comprises (a) 10~60 wt % of at least two kinds of acrylic resins having unsaturated carboxylic acid monomers as polymerized units; (b) 5~20 wt % of a photosensitive resin having at least two (meth)acrylate groups; (c) 0.1~15 wt % of a photoinitiator; and (d) 0.5~20 wt % of a thermo-curing agent. The resin composition of the invention is suitable for use as a photoresist in the process of producing printed circuit boards. The resin composition of the invention is particularly suitable for use in the surface of printed circuit boards or semiconductor packages as a protective dry film solder mask.

10 Claims, No Drawings

HALOGEN-FREE DRY FILM PHOTOSENSITIVE RESIN COMPOSITION

BACKGROUND OF THE INVENTION

1. Field of the Invention

The invention relates to a dry film type of a halogen-free thermo-curing photosensitive resin composition, which can be used as a photoresist in printed circuit boards. The resin composition of the invention is particularly suitable for use in the surface of printed circuit boards and semiconductor packages as a protective dry film solder mask.

2. Description of the Prior Art

In recent years, due to the development trend of electronic products towards smart, portable, high function and high density and the demands of electronic constructions for high I/O count, miniaturization, and small area, the technology regarding printed circuit boards must be continually improved, and the physical properties of related materials also need to be improved.

After the circuits of printed circuit boards are finished, they should be coated and protected with an insulating resin film, so as to avoid oxidization and short circuits during welding. The protective coating film for the surfaces of printed circuit boards is referred to as solder mask. Due to the more strict conditions for processing and applications, in addition to the physical properties regarding insulation, heat resistance of solders, high rigidity, and chemical resistance, a solder mask should also exhibit the properties of high resolution, fast development, electroplating resistance, electroless plating resistance, and high temperature and moisture resistance. In order to achieve the above high-functional physical properties, many solutions for improving solder masks have been proposed in the prior art. For example, Japanese Laid-Open Patent Appln. No. 11-21327 discloses a light curing resin obtained via the reaction of epoxy resin/(meth)acrylic acid and a monocarboxylic acid compound/anhydride, wherein the monocarboxylic acid compound has more than two light curable unsaturated groups, such that the light curability of the composition could be improved, thereby reducing the exposure amount. However, for a high-efficiency exposure machine, this does not significantly save the exposure time nor does it significantly enhance the bonding and developing speed. In another aspect, Japanese Laid-Open Patent Appln. No. 10-274849 discloses a solder photoresist ink composition, but its development speed is slow, and the physical properties regarding electroless plating resistance and high temperature and moisture resistance are poorer. Moreover, Japanese Laid-Open Patent Appln. No. 5-202332 discloses a composition containing a photosensitive resin (with more than two acrylate groups and more than one carboxylic acid group in one molecule), which has a high resolution, and excellent electrical properties, but the molecular weight of the photosensitive resin is less than 1000, and the touch dry property is poor.

Furthermore, previous wet solder masks are produced by means of direct heat baking after screen printing to cure the film. However, since the solder mask may penetrate onto the copper surface at the circuit joint during printing and curing, resulting in problems associated with welding parts and relevant applications, the solder mask is normally used in simple circuit boards, and dry film solder masks are used instead in manufacture.

In addition, since all plastic products burn easily, flame-retardants will be added. In the past, since the flame-retardants containing a halogen achieved a good balance between cost and performance and could be used in a broad spectrum, such flame-retardants played a dominant role in the application to plastics. However, with the increasing concern about environmental protection, the use of the flame-retardants containing a halogen becomes limited due to the irritant and corrosive gases of dioxin or benzofuran produced during burning the flame-retardants, as well as the carcinogenic effect of these gases. At present, the flame-retardants are developing towards multifunctional purposes. People have paid more attention to improving the flame retardant efficiency, reducing the amount, and eliminating the risk to health and to the environment. Thus, "halogen-free" has become a main tendency in the development and application of flame-retardants.

SUMMARY OF THE INVENTION

An object of the invention is to provide a halogen-free dry film thermo-curing photosensitive resin composition, which can be applied to the surface of printed circuit boards and semiconductor packages as a protective coating solder mask. On the other hand, the composition of the invention is halogen-free and exhibits the properties of a low flammability, a high resolution, and being able to be fast developed, and can also be used as a photoresist in the process of producing printed circuit boards.

DETAILED DESCRIPTION OF THE INVENTION

The invention provides a dry film photosensitive resin composition, which comprises: (a) 10~60 wt % of at least two kinds of acrylate resins having unsaturated carboxylic acid monomers as polymerized units; (b) 5~20 wt % of a photosensitive resin having at least two (meth)acrylate groups; (c) 0.1~15 wt % of a photoinitiator; and (d) 0.5~20 wt % of a thermo-curing agent.

The resin composition of the invention is mainly characterized in that the component (a) is a mixture of the two different kinds of acrylic resins with different molecular weights. The component (a) in the composition of the invention is used as a binder, which imparts good film-forming and flexibility properties to the dry film photosensitive resin composition of the invention. Moreover, due to the presence of a carboxyl group, the development speed of the photosensitive resin composition can be promoted, and the cross-linking density of the photosensitive resin composition can be increased via the thermo-curing. The preferred average molecular weights (Mw) of these two kinds of acrylic resins are Mw=15000~30000 and Mw=160000~220000, respectively, and the preferred acid value ranges of these two kinds of acrylic resins are 180~250 mg KOH/g and 150~200 mg KOH/g, respectively.

The acrylic resins suitable for the invention contain unsaturated carboxylic acid monomers as polymerized units.

Suitable unsaturated carboxylic acid monomers do not require any special limitation and include, for example, but are not limited to, acrylic acid, methacrylic acid, crotonic acid, cinnamic acid, 2-methacryloyloxyethyl succinate, 2-acryloyloxyethyl succinate, 2-methacryloyloxyethyl hexahydrophthalate, 2-acryloyloxyethyl hexahydrophthalate, 2-methacryloyloxyethyl phthalate, and 2-acryloyloxyethyl phthalate, and a mixture thereof, among which acrylic acid and methacrylic acid and a mixture thereof are more preferred.

The component (b) of the inventive composition is a photosensitive resin having at least two (meth)acrylate functional groups. The photosensitive resins suitable for the inventive composition are selected from the group consisting of 1,4-butanediol di(meth)acrylate, 1,6-hexanediol di(meth)acrylate, neopentylglycol di(meth)acrylate, polyethylene glycol di(meth)acrylate, neopentylglycol adipate di(meth)acrylate, neopentylglycol di(meth)acrylate hydroxypivalate, dicyclopentadienyl di(meth)acrylate, caprolactone modified dicyclopentadienyl di(meth)acrylate, allylated cyclohexyl di(meth)acrylate, isocyanurate di(meth)acrylate, trimethylol propane tri(meth)acrylate, dipentaerythriol tri(meth)acrylate, pentaerythriol tri(meth)acrylate, methyl trimethyl tri(meth)acrylate, tris(acryloxyethyl)isocyanurate), dipentaerythriol penta(meth)acrylate, and dipentaerythriol hexa(meth)acrylate and a mixture thereof.

The component (c) of the composition according to the invention is a photoinitiator, which is able to provide a free radical upon being light irradiated, and a polymerization reaction can be initiated through the transfer of the free radical. The species of the photoinitiators are well known to persons having ordinary skill in the art. The photoinitiators suitable for the invention include, for example, but are not limited to, benzoin, benzoin alkyl ether, benzil, ketals, acetophenones, benzophenone, 4,4'-dimethyl-amino-benzophenone, thioxanthones, and morpholino-propanone compounds, and a mixture thereof.

The component (d) of the composition according to the invention is a thermo-curing agent, which refers to an agent that can be cured by heat or can be permanently cured when heated to certain temperatures. The curing agent suitable for the invention may be an anhydride or an epoxy resin. Useful anhydrides do not require any special limitation, and include, for example, but are not limited to, maleic anhydride, phthalic anhydride, tetrahydrophthalic anhydride, hexahydrophthalic anhydride, methyltetrahyrophthalic anhydride, ethyltetrahydrophthalic anhydride, methylhexahydrophthalic anhydride, ethylhexahydrophthalic anhydride, succinic anhydride and itaconic anhydride, and a mixture thereof. Epoxy resins that may be used as curing agents are well known to persons having ordinary skill in the art, which include, for example, but are not limited to, bisphenol type epoxy resin, phenol novolac type epoxy resin, cresol novolac type epoxy resin, naphthalene type epoxy resin, glycidyl ester resin and glycidyl amine resin, and a mixture thereof.

The composition of the invention may optionally comprise an additive well known to persons skilled in the art as Component (e). Examples of the additive include, but are not limited to, flame retardant, heat stabilizer, antioxidant, light stabilizer, lubricant, anti-foaming agent, planarizing agent, colorant, and filler and a combination thereof.

In the composition of the invention, the halogen content of each of the components, based on the weight of each component, is respectively less than 1000 ppm, and the total halogen content of the composition, based on the total weight of the composition, is lower than 200 ppm. Therefore, the composition is deemed a halogen-free composition. In addition, a non-halogen flame retardant is selected as the flame retardant additive, and therefore, the composition would fulfill the environmental demands.

The dry film photosensitive resin composition of the invention is useful on the surfaces of printed circuit boards or semiconductor packages as a protective dry film solder mask. The resin composition of the invention may be applied to the surfaces of printed circuit boards or semiconductor packages via any methods conventionally known to persons skilled in the art. For example, the dry film photosensitive resin composition may be pressed onto the surface of a substrate via a vacuum laminator so as to form a solder mask film on the surface and be exposed to UV light so as to cause a polymerization. Thereafter, the non-irradiated area on the coating film may be removed by being developed with an aqueous sodium carbonate solution. Finally, the resin in the solder mask can be completely cured by a high temperature baking. The dry film solder mask formed from the dry film photosensitive resin composition of the invention is insulating and able to protect the circuits, and has superior performance in avoiding the oxidization of circuits and short circuits during welding.

Since the dry film photosensitive resin composition of the invention has the properties of high resolution, electroplating resistance, electroless plating resistance and high temperature and moisture resistance, and being able to be fast developed, it may also be used as a photoresist in the process of producing printed circuit boards according to the conventional methods known to persons having ordinary skill in the art. For example, a copper foil substrate is cut into a suitable size; the dry film photosensitive resin composition of the invention is applied thereon under a suitable temperature and pressure, shielded with a mask, and sent to an exposure machine for exposure; and thereafter, the protective film is torn off. After that, the un-exposed area on the film surface is removed by the development with sodium carbonate, and then the exposed copper foil can eroded with a mixed solution of hydrochloric acid and hydrogen peroxide such that a circuit is formed, and finally, the dry film photoresist can be washed off with sodium hydroxide.

The invention will be further illustrated by the following examples.

EXAMPLES

Synthesis of a First Acrylic Resin:

13.44 g acrylic acid monomer and 30.39 g styrene were placed in a reactor, with 1.35 g of benzoyl peroxide used as the catalyst and 54.82 g of methyl ethyl ketone used as the solvent. The reaction were warmed up to 90° C. and reacted for 24 hours to form an Acrylic Resin A-1 with a molecular weight of between 15000 and 30000, and an acid value of from 180 and 250 mg KOH/g.

Synthesis of a Second Acrylic Resin:

5.08 g n-butyl acrylate, 3.63 g styrene, 9.13 g methyl (meth)acrylate and 7.15 g methacrylic acid monomers were placed in a reactor, with 0.154 g benzoyl peroxide used as the catalyst and a mixture of 31.183 g isopropanol and 43.655 g methyl ethyl ketone used as the solvent. The reaction was warmed up to 90° C. and reacted for 24 hours to form Acrylic Resin with an average molecular weight between 160000 and 220000, and an acid value between 150 and 200 mg KOH/g.

Polymerization of Dry Film Photosensitive Resin Compositions:

Photosensitive resin compositions containing the components and amounts as shown in Table 1 were prepared by stirring the components with a double shaft mixer to obtain uniform compositions, and maintained at 40~60° C.

TABLE 1

Formulas of Dry Film Photosensitive Resin Compositions

| Dry Film Photosensitive Resin Composition (g) | | Examples | | | Comparative Examples | |
|---|---|---|---|---|---|---|
| | | 1 | 2 | 3 | 1 | 2 |
| (a) Acrylic resin | A-1 | 34 | 35 | 36 | 96 | — |
| | A-2 | 80 | 78 | 77 | — | 190 |
| (b) Photosensitive resin | B | 20 | 20 | 20 | 20 | 20 |
| (c) Photoinitiator | C | 1 | 0.8 | 1.5 | 1 | 0.8 |
| (d) Thermo-curing agent | D-1 | 20 | 22 | — | 21 | — |
| | D-2 | — | — | 20 | — | 22 |
| (e) Additive(s) | $SiO_2$ | 6 | 7 | 8 | 8 | 7 |
| | Talc | 2 | — | — | — | — |
| | Blue pigment | 0.4 | 0.6 | 0.5 | 0.4 | 0.4 |

Notes:
B: trimethylol propane tri(meth)acrylate, TMPTMA, UCB Company
C: 2-methyl-1-[4-(methylthio)phenyl]-2-(4-morpholinyl)-1-acetone(Irgacure 907, Ciba Company)
D-1: maleic anhydride, Monsanto Company
D-2: diglycidyl ether of bisphenol A (DER-331, Dow Chemical Company)
SiO2: silicon dioxide (Walsh & Assoc Company)
Talc: talc $Mg_6[Si_8O_2O](OH)_4$ (Walsh & Assoc Company)

Property Test

Each of the resin compositions was coated on a polyethylene terephthalate (PET), baked at 88° C. for 3 minutes, then hot pressed (T=113° C., P=1.5 Kg/cm$^2$) onto a copper-clad substrate using a roll to form a test specimen. The test specimen was covered with a negative having a gray scale and resolution pattern, and exposed with a UV exposure machine, then developed with a 1% aqueous $Na_2CO_3$ solution while observing the development time. Then, the test specimen was washed with water and evaluated the photosensitive properties thereof in terms of the gray scale and resolution. Finally, the specimen was baked at 150° C. for 60 minutes to have it cured. The specimen was tested in terms of the insulation and high temperature and moisture resistance.

Development speed: developing with a 1% aqueous $Na_2CO_3$ solution and recording the time needed to completely remove the unexposed patterned portions.

Gray scale: observing the gray scale pattern, and recording the minimum scale number when the dry film was completely removed.

Insulation: placing a surface resistance tester on the test specimen, and testing and recording the insulation of the dry film.

High temperature and moisture resistance (pressure cooker test, simply called PCT): placing the test specimen into a pressure cooker (121° C., 2 atm, and 100% relative humidity (RH)), taking it out after one hour for carrying out a 100-lattice bonding test, and recording the number of the lattices in the 100 lattices that retain good bonding, wherein (0/100) represents no bonding property, and 100/100 represents good bonding.

Test Results:

TABLE 2

Results of Physical Property Tests

| | Examples | | | Comparative Example | |
|---|---|---|---|---|---|
| | 1 | 2 | 3 | 1 | 2 |
| Appearance | Blue Dry Film | Blue Dry Film | Blue Dry Film | Blue Dry Film | Having a colorless area in the film surface |
| Developing Speed | 11 sec | 10 sec | 10 sec | 10 sec | 20 sec |
| Gray Scale (21 Step) | 10 | 11 | 10 | 7 | 14 |
| Resolution (μm) | 20 | 20 | 20 | 20 | 30 |
| Insulation (Ω/cm$^2$) | $1 \times 10^{13}$ | $1 \times 10^{13}$ | $1 \times 10^{13}$ | $1 \times 10^{13}$ | $1 \times 10^{13}$ |
| High temperature and moisture resistance | 100/100 | 100/100 | 100/100 | 91/100 | 98/100 |
| Total halogen content | 149 | 167 | 175 | | |
| Storage life (60° C. × 30 days) | Normal | Normal | Normal | Bilateral Flowing Glue | Developing speed becoming slower |

The total halogen contents of Examples 1~3 are respectively 149 ppm, 167 ppm, and 175 ppm, which meet the halogen-free requirements. Examples 1~3 are directed to the compositions according to the present invention that contain two different kinds of acrylic resins with different molecular weights. The results of the tests show that they have good development speed, resolution, insulation, and high temperature and moisture resistance. The compositions of Comparative Examples 1 and 2 do not contain two acrylic resins, and the results of the tests show that they exhibit poor physical properties. For example, Comparative Example 1 shows flowing glue occurring on the side edges when the composition is coated and formed into a dry film and a poorer storage life; Comparative Example 2 displays a phase separation when the composition is coated and formed into a dry film. Thus, as seen from the physical properties shown in Table 2, the addition of two different kinds of acrylic resins with different molecular weights to the dry film photosensitive resin compositions as a binder can impart the dry film photosensitive resin compositions with good film-forming and flexibility properties, and due to the presence of a carboxylic group, the development speed of the resin compositions can be promoted.

Although the preferred embodiments of the invention have been disclosed above, they are not intended to limit the scope of the invention, and all changes and modifications that could be made by person having ordinary skill in the art are contemplated in the claims of the invention without departing from the spirit and scope of the present invention.

What is claimed is:

1. A dry film photosensitive resin composition, comprising:
   (a) 10~60 wt % of a mixture of two different kinds of acrylic resins having an unsaturated carboxylic acid monomer as polymerized unit, wherein the average molecular weights of the two different kinds of acrylic resins are respectively between 15000 and 30000 and between 160000 and 220000;
   (b) 5~20 wt % of a photosensitive resin having at least two (meth)acrylate groups;
   (c) 0.1~15 wt % of a photoinitiator; and
   (d) 0.5~20 wt % of a thermo-curing agent.

2. The resin composition of claim 1, wherein the acid values of the two different kinds of acrylic resins are respectively 180~250 mg KOH/g and 150~200 mg KOH/g.

3. The resin composition of claim 1, wherein the unsaturated carboxylic acid monomer of component (a) is selected from the group consisting of acrylic acid, methacrylic acid, crotonic acid, cinnamic acid, 2-methacryloyloxyethyl succinate, 2-acryloyloxyethyl succinate, 2-methacryloyloxyethyl hexahydrophthalate, 2-acryloyloxyethyl hexahydrophthalate, 2-methacryloyloxyethyl phthalate, and 2-acryloyloxyethyl phthalate and a mixture thereof.

4. The resin composition of claim 1, wherein the unsaturated carboxylic acid monomer of component (a) is acrylic acid or methacrylic acid, or a mixture thereof.

5. The resin composition of claim 1, wherein the photosensitive resin of component (b) is selected from the group consisting of 1,4-butanediol di(meth)acrylate, 1,6-hexanediol di(meth)acrylate, neopentylglycol di(meth)acrylate, polyethyleneglycol di(meth)acrylate, neopentylglycol adipate di(meth) acrylate, neopentylglycol di(meth)acrylate hydroxypivalate, dicyclopentadienyl di(meth)acrylate, caprolactone modified dicyclopentdienyl di(meth)acrylate, allylated cyclohexyl di(meth)acrylate, isocyanurate di(meth)acrylate, trimethylol propane tri(meth)acrylate, dipentaerythriol tri(meth)acrylate, pentaerythriol tri(meth)acrylate, methyl trimethyl tri(meth)acrylate, tris(acryloxyethyl) isocyanurate, dipentaerythriol penta(meth)acrylate, and dipentaerythriol hexa(meth)acrylate and a mixture thereof.

6. The resin composition of claim 1, wherein the photoinitiator of component (c) is selected from the group consisting of benzoin, benzoin alkyl ether, benzil, ketals, acetophenone compounds, benzophenone, 4,4'-dimethylamino-benzophenone, thioxanthone compounds, and morpholino-propanone compounds, and a mixture thereof.

7. The resin composition of claim 1, wherein the thermo-curing agent of component (d) is an anhydride or an epoxy resin.

8. The resin composition of claim 1, which is characterized by a total halogen content of less than 200 ppm.

9. The resin composition of claim 1, which is used as a solder mask on the surface of printed circuit boards or semiconductor packages.

10. The resin composition of claim 1, which is used as a photoresist in the process of producing printed circuit boards.

* * * * *

UNITED STATES PATENT AND TRADEMARK OFFICE
CERTIFICATE OF CORRECTION

PATENT NO. : 7,261,996 B2  Page 1 of 1
APPLICATION NO. : 11/341878
DATED : August 28, 2007
INVENTOR(S) : Feng-Yi Wang It is certified that error appears in the above-identified patent and that said Letters Patent is hereby corrected as shown below:

On title page, item 73, "CN" should read -- TW --.

Signed and Sealed this

Eighth Day of April, 2008

JON W. DUDAS
*Director of the United States Patent and Trademark Office*